United States Patent
Suzuki

(10) Patent No.: US 9,793,848 B2
(45) Date of Patent: Oct. 17, 2017

(54) DRIVING APPARATUS FOR SWITCHING ELEMENT

(71) Applicant: DENSO CORPORATION, Kariya, Aichi-pref. (JP)

(72) Inventor: Tomotaka Suzuki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/044,548

(22) Filed: Feb. 16, 2016

(65) Prior Publication Data
US 2016/0241180 A1   Aug. 18, 2016

(30) Foreign Application Priority Data
Feb. 16, 2015 (JP) .................... 2015-027141

(51) Int. Cl.

| | |
|---|---|
| *H02P 1/04* | (2006.01) |
| *H02P 27/08* | (2006.01) |
| *H02M 7/00* | (2006.01) |
| *H02P 6/08* | (2016.01) |
| *B60L 11/00* | (2006.01) |
| *H03K 17/0412* | (2006.01) |
| *H03K 17/16* | (2006.01) |
| *H02M 7/5387* | (2007.01) |
| *H02M 1/00* | (2006.01) |

(52) U.S. Cl.
CPC ............ *H02P 27/085* (2013.01); *B60L 11/00* (2013.01); *H02M 7/00* (2013.01); *H02P 6/085* (2013.01); *H03K 17/0412* (2013.01); *H03K 17/163* (2013.01); *H02M 7/53875* (2013.01); *H02M 2001/007* (2013.01); *H02M 2001/0048* (2013.01)

(58) Field of Classification Search
CPC ............ H02P 27/085; H02P 23/28; H02M 2001/0054; H02M 7/527; H02M 2001/0054
USPC ..................................... 318/400.17
See application file for complete search history.

(56) References Cited

U.S. PATENT DOCUMENTS

| | | | |
|---|---|---|---|
| 2010/0250067 A1* | 9/2010 | Matsumura ............ | B62D 5/046 701/41 |
| 2013/0049666 A1* | 2/2013 | Osugi .................... | H02P 27/08 318/503 |

(Continued)

FOREIGN PATENT DOCUMENTS

JP   2011-010441 A   1/2011

*Primary Examiner* — Bickey Dhakal
(74) *Attorney, Agent, or Firm* — Oliff PLC

(57) ABSTRACT

A power conversion circuit is mounted in a vehicle and controls an output torque of the rotating machine based on a requested command torque. A driving apparatus of a switching element controls a current flowing to the rotating machine. The driving apparatus sets at least one of a turn-on speed and a turn-off speed for the switching element to a plurality of switching speeds that are discretely determined, based on a parameter that is correlated with the output torque and has a controllable value. The driving apparatus turns on or off the switching element at the switching speeds. The switching speeds are allocated to the respective magnitudes of the parameter at uneven intervals, and determined such that the number of allocated switching speeds is greater in a range in which an occurrence frequency of the parameter is high, compared to a range in which the occurrence frequency is low.

12 Claims, 3 Drawing Sheets

(56) References Cited

U.S. PATENT DOCUMENTS

2014/0042939 A1* 2/2014 Kobayashi .............. H02P 27/08
　　　　　　　　　　　　　　　　　　　　　　　　318/400.3
2014/0225553 A1* 8/2014 Otorii ................. H02M 1/4225
　　　　　　　　　　　　　　　　　　　　　　　　318/722

* cited by examiner

DRIVING APPARATUS FOR SWITCHING ELEMENT

CROSS-REFERENCE TO RELATED APPLICATION

This application is based on and claims the benefit of priority from Japanese Patent Application No. 2015-027141, filed Feb. 16, 2015. The entire disclosure of the above application is incorporated herein by reference.

BACKGROUND

Technical Field

The present disclosure relates to a driving apparatus for a switching element

Related Art

As a power conversion circuit that is connected to an alternating-current motor that is mounted in a vehicle, a configuration is known in which a plurality of switching elements are provided. The switching elements form serially connected members that are provided in an upper arm and a lower arm. In this configuration, power conversion is performed by switching operations being performed on the switching elements.

In addition, as a method for driving the switching elements in a power conversion circuit such as this, a technique is known in which the switching speed for turning on or turning off the switching elements is made variable (refer, for example, to JP-A-2011-10441). Specifically, a technique is known in which charging speed or discharging speed is switched between multiple stages, based on information on a current flowing to the switching elements. The charging speed is the speed at which the gate of a switching element is charged with electrical charge. The discharging speed is the speed at which electrical charge is discharged from the gate of the switching element, In the configuration in which the switching speed for turning on/off the switching elements is made variable, it is thought that loss reduction effect decreases when the switching speed is discretely changed, compared to when the switching speed is continuously changed. However, contrarily, there is concern that the configuration will become complex and cost will increase in cases in which the switching speed is continuously changed. Therefore, it is thought that there is room for technical improvement regarding the setting of switching speed for switching elements.

SUMMARY

It is thus desired to provide a driving apparatus for a switching element that is capable of achieving an improvement in loss reduction effect.

An exemplary embodiment of the present disclosure provides a driving apparatus for a switching element that is applicable to a power conversion circuit that is electrically connected to a rotating machine that is mounted in a vehicle and controls an output torque of the rotating machine based on a requested command torque. The driving apparatus for a switching element controls a current flowing to the rotating machine by turning on/off a switching element. The driving apparatus for a switching element includes a speed setting unit and a driving unit. The speed setting unit sets at least one of a turn-on speed and a turn-off speed for the switching element to a plurality of switching speeds that are discretely determined based on a parameter that is correlated with the output torque and has a controllable value. The driving unit turns on or off the switching element at the switching speeds set by the speed setting unit. The switching speeds are allocated to respective magnitudes of the parameter at uneven intervals, and determined such that the number of allocated switching speeds is greater in a range in which an occurrence frequency of the parameter is high, compared to a range in which the occurrence frequency of the parameter is low.

In the above-described configuration, regarding the switching element in the power conversion circuit, the switching speeds are discretely allocated to the respective magnitudes of the parameter at uneven intervals. Therefore, loss reduction effect can be improved in a localized range within an overall possible range of the parameter. In this case, the total number of allocated switching speeds (i.e., the total number of switching speeds that are set) can be limited and complexity of the configuration can be minimized. In addition, in the rotating machine that is mounted in a vehicle, bias occurring in the occurrence frequency of the parameter depending on the manner of use of the vehicle can be considered. However, because the switching speeds are determined such that the number of allocated switching speeds is greater in a range in which the occurrence frequency of the parameter is high, compared to a range in which the occurrence frequency is low, the switching speed can be appropriately changed taking into consideration the bias in the occurrence frequency. Therefore, upon limiting the total number of allocated switching speeds (i.e., the number of switching speeds that are set), the desired loss reduction effect can be achieved. As a result, the loss reduction effect can be improved while suppressing complexity of the configuration.

DESCRIPTION OF THE EMBODIMENTS

An embodiment of the present disclosure will be described hereinafter with reference to the drawings. According to the present embodiment, an embodiment that is applied to a hybrid vehicle will be described. The hybrid vehicle includes a rotating machine and an engine as the main engines of the vehicle.

Figure 1:
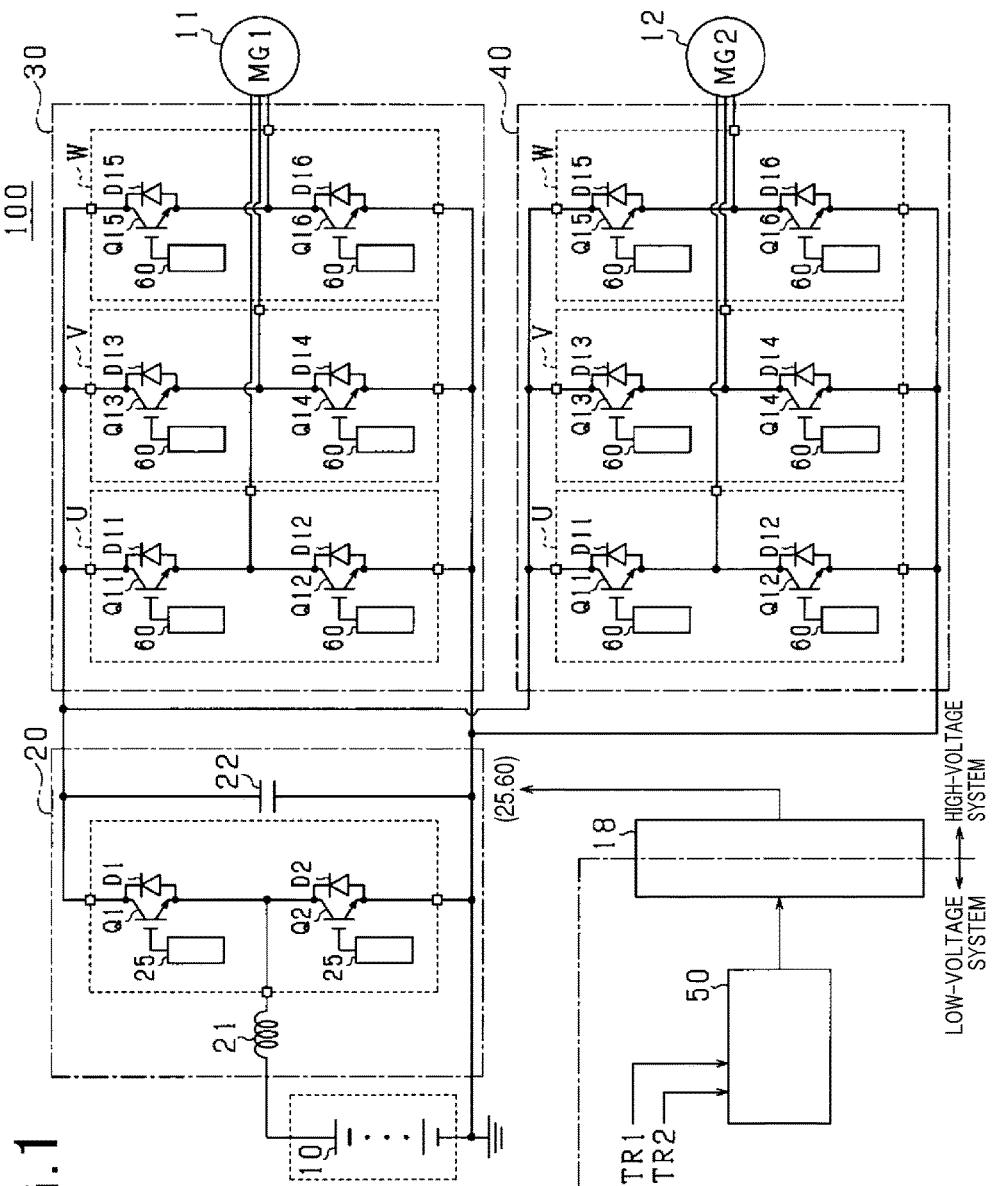
FIG. 1 is a diagram showing a configuration of a power conversion system that is mounted to a vehicle including motors and applied to a driving apparatus for a switching element according to an embodiment.

In FIG. 1, the vehicle includes motors 11 and 12, and a power conversion system 100. The power conversion system 100 supplies power to the motors 11 and 12. The power conversion system 100 includes a direct-current power supply 10, a converter 20, inverters 30 and 40, a control unit 50, and drive units 60.

Each motor 11 and 12 is a three-phase synchronous-type or three-phase induction-type alternating-current motor generator. The motor 11 (MG1) is used as a power generator that is driven by an engine (not shown) or a rotating electric machine that is capable of starting the engine. The power obtained through power generation by the motor 11 can be used to drive the motor 12 or charge the direct-current power supply 10. The motor 12 (MG2) is used as an electric motor for driving that generates torque to drive a drive wheel (not shown) of the vehicle. The motor 12 functions as a power generator that outputs power during regeneration. The motor 11 corresponds to a first rotating machine. The motor 12 corresponds to a second rotating machine.

The direct-current power supply 10 is a high-voltage power supply. A battery composed of a chargeable/dischargeable secondary battery, such as a lithium ion battery or a nickel-hydrogen battery, a capacitor, and the like can be used as the direct-current power supply 10.

The converter 20 is a direct-current to direct-current (DCDC) converter that is capable of stepping up and stepping down voltage. During power running of the motors 11 and 12, the converter 20 steps up the voltage from the direct-current power supply 10 as required and supplies the voltage to the inverters 30 and 40. During power generation by the motors 11 and 12, the converter 20 steps down the voltage (voltage after conversion to direct-current voltage) generated through power generation and charges the direct-current power supply 10. Specifically, the converter 20 includes a reactor 21, switching elements Q1 and Q2, diodes D1 and D2, and a smoothing capacitor 22. The switching elements Q1 and Q2 are connected in series. The diodes D1 and D2 are respectively connected in anti-parallel to the switching elements Q1 and Q2, such that current flows from the emitter side to the collector side. The reactor 21 is connected between the intermediate point between the switching elements Q1 and Q2, and the direct-current power supply 10. The direct-current power supply 10 and the converter 20 configure a power supply circuit.

The converter 20 adjusts the power supply voltage applied to the inverters 30 and 40 to a predetermined voltage range. In this case, the converter 20 adjusts the power supply voltage (so-called system voltage) within a range in which a lower limit value VL is the voltage of the direct-current power supply 10 and an upper limit value VH is the voltage of a predetermined step-up upper limit.

The inverter 30 is connected to the converter 20 and the motor 11. The inverter 40 is connected to the converter 20 and the motor 12. The inverter 30 corresponds to a first power conversion circuit. The inverter 40 corresponds to a second power conversion circuit. The inverters 30 and 40 each include U-phase, V-phase, and W-phase arms. The U-phase, V-phase, and W-phase arms are provided with switching elements Q11 to Q16 and diodes D11 to D16. The switching elements Q11 to Q16 are connected in series by twos. The diodes D11 to D16 are respectively connected in anti-parallel to the switching elements Q11 to Q16.

Specifically, the U-phase arm is provided with the switching elements Q11 and Q12, and the diodes D11 and D12. The V-phase arm is provided with the switching elements Q13 and Q14, and the diodes D13 and D14. The W-phase arm is provided with the switching elements Q15 and Q16, and the diodes D15 and D16. In the above-described configuration, the intermediate point between the upper and lower arms of each phase of the inverter 30 is connected to a coil (not shown) of the motor 11. The intermediate point between the upper and lower arms of each phase of the inverter 40 is connected to a coil (not shown) of the motor 12.

An insulated-gate bipolar transistor (IGBT) is used for each of the switching elements Q1, Q2, and Q11 to Q16. In addition, a metal-oxide-semiconductor field-effect transistor (MOS-FET), a bipolar transistor, and the like may be used for each of the switching elements Q1, Q2, and Q11 to Q16.

The control unit 50 uses a low-voltage battery (not shown) as a power source. The control unit 50 is mainly configured by a microcomputer that is composed of a central processing unit (CPU), a read-only memory (ROM), a random access memory (RAM), and the like. The control unit 50 generates pulse-like command signals for controlling on/off of the switching elements in the converter 20 and the inverters 30 and 40, to control the controlled variables of the motors 11 and 12 to the command values thereof.

According to the present embodiment, the control unit 50 receives input of torque command values TR1 and TR2 as the controlled variables of the motors 11 and 12. The control unit 50 then generates the pulse-like command signals for controlling on/off of the switching elements in the converter 20 and the inverters 30 and 40 based on the torque command values TR1 and TR2. The torque command values TR1 and TR2 are inputted from a higher-order control unit (high-order electronic control unit (ECU), not shown) that governs control of the vehicle.

When driving the motors 11 and 12, the control unit 50 calculates an on/off ratio (such as a duty ratio) for turning on/off the switching elements Q1 and Q2 of the converter 20, based on the torque command values of the motors 11 and 12. The control unit 50 then generates command signals for alternately turning on and off the upper- and lower-arm switching elements Q1 and Q2, based on the on/off ratio. The control unit 50 outputs the command signals to drive units 25. As a result, the power supply voltage applied to the inverters 30 and 40 are controlled in the converter 20.

In addition, when driving the motors 11 and 12, the control unit 50 calculates an on/off ratio (such as a duty ratio) for turning on/off the switching elements Q11 to Q16 of the inverters 30 and 40, based on the torque command values of the motors 11 and 12. The control unit 50 then generates command signals for alternately turning on and off the upper- and lower-arm switching elements of each phase, based on the on/off ratio. The control unit 50 then outputs the command signals to drive units 60. As a result, the output current outputted to the motors 11 and 12 are adjusted in the inverters 30 and 40. That is, the switching elements Q11 to Q16 are turned on and off based on the output torques (torque command values) of the motors 11 and 12, and the currents flowing to the motors 11 and 12 are variably adjusted.

A drive unit 25 is connected to each of the switching elements Q1 and Q2 of the converter 20. A drive unit 60 is connected to each of the switching elements Q11 to Q16 of the inverters 30 and 40. The drive units 25 and 60 are each configured to include a single-chip semiconductor integrated circuit and a low-voltage power supply. The drive units 25 and 60 generate gate drive signals for driving the gates of the respective switching elements Q1, Q2, and Q11 to Q16 based on the pulse-like command signals inputted from the control unit 50. The drive units 25 and 60 also monitor the drive states of the respective switching elements Q1, Q2, and Q11 to Q16.

Signal transmission between the control unit 50 and each of the drive units 25 and 60 is performed via an interface 18. The interface 18 electrically insulates a high-voltage system from a low-voltage system. The high-voltage system includes the high-voltage direct-current power supply 10. The low-voltage system includes the low-voltage battery (not shown). The interface 18 thereby protects the control unit 50 from the high drive voltage (such as several hundred volts) supplied to the converter 20 and the inverters 30 and 40. For example, a photocoupler is used as the interface 18.

Figure 2:
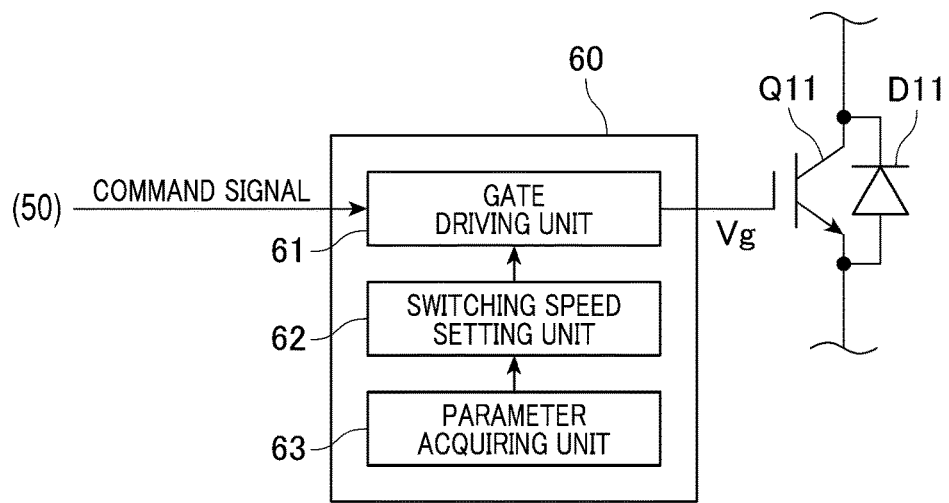
FIG. 2 is a diagram showing a configuration of a drive unit configured in the driving apparatus shown in FIG. 1.

Here, the configuration of the drive units 60 of the inverters 30 and 40 will be described in detail. FIG. 2 shows an example of the configuration of the drive unit 60 connected to the switching element Q11. The drive units 60 connected to the switching elements Q11 to Q16 all have a similar configuration.

The drive unit 60 includes a gate driving unit 61, a switching speed setting unit 62, and a parameter acquiring unit 63. The gate driving unit 61 outputs a gate drive signal based on the pulse-like command signals inputted from the control unit 50. The gate drive signal controls on/off of the corresponding switching element among the switching elements Q11 to Q16. That is, the gate driving unit 61 outputs the gate drive signal so as to: (i) step up the drive voltage (gate voltage Vg) of the corresponding switching element among the switching elements Q11 to Q16 during a turn-on period of the pulse-like command signal; and (ii) reduce the drive voltage of the corresponding switching element during a turn-off period of the command signal.

The switching speed setting unit 62 sets the switching speed for turning on and off of the corresponding switching element among the switching elements Q11 to Q16 so as to suppress surge voltage when the corresponding switching element is turned on and off. The switching speed for turning on the switching elements Q11 to Q16 corresponds to a turn-on speed. The switching speed for turning OFF the switching elements Q11 to Q16 corresponds to a turn-off speed. A charge/discharge process of the gate is performed by the gate driving unit 61 based on the switching speeds set by the switching speed setting unit 62. At this time, when the switching elements Q11 to Q16 are turned ON, the turn-on speed is controlled by the charge current of the gate being adjusted. When the switching elements Q11 to Q16 are turned off, the turn-off speed is controlled by the discharge current of the gate being adjusted.

According to the present embodiment, the turn-on speed and the turn-off speed of the switching elements Q11 to Q16 are set to any of a plurality of switching speeds that are discretely determined, based on a parameter related to the output torques of the motors 11 to 12. The switching speed setting unit 62 performs setting of the switching speed based on a parameter acquired by a parameter acquiring unit 63. The parameter is, for example, the power supply voltage (i.e., system voltage) of the inverters 30 and 40. The parameter is a parameter of which the value (i.e., magnitude) is controllable, that is, recognizable and adjustable by the drive unit 60 itself. The switching speed setting unit 62 variably changes the switching speed based on the power supply voltage or a correlated value thereof.

Here, in the motors 11 and 12 that are mounted in a vehicle, when the power supply voltage applied to the inverters 30 and 40 is variable, it is thought that bias occurs in the occurrence frequency of the magnitude of the power supply voltage. Therefore, according to the present embodiment, a plurality of switching speeds are allocated at uneven intervals within a range from the lower limit value VL to the upper limit value VH of the power supply voltage, taking into consideration the occurrence frequency of the magnitude of the power supply voltage.

Figure 3:
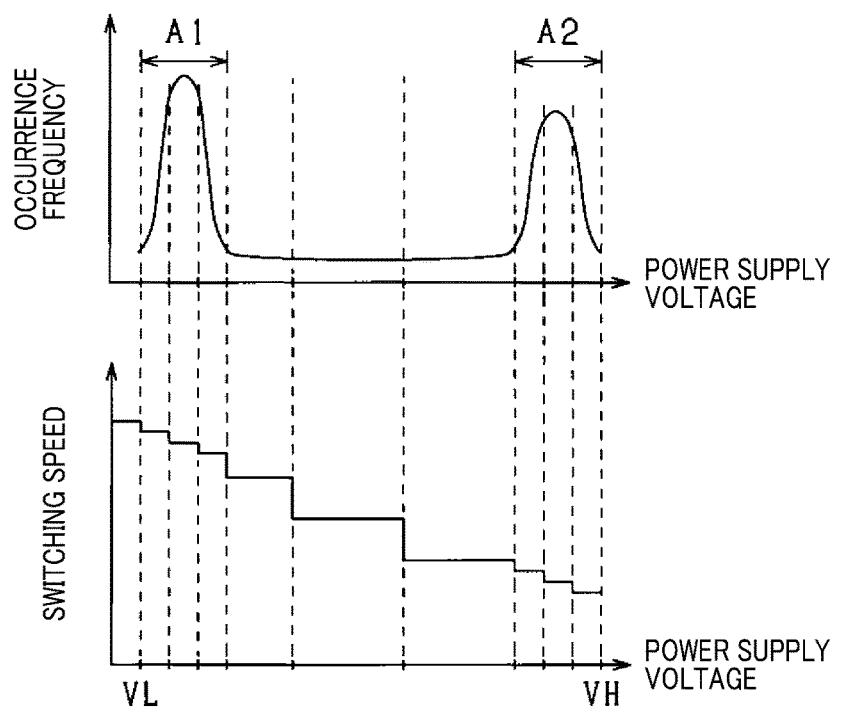
FIG. 3 is a diagram showing a relationship between an occurrence frequency of a power supply voltage and a switching speed.

Specifically, a case in which the motors 11 and 12 are driven during actual use of the vehicle will be supposed. As shown in FIG. 3, the occurrence frequency regarding the magnitude of the power supply voltage is not uniform. The occurrence frequency is higher in a lower limit range A1 including the lower limit value VL and an upper limit range A2 including the upper limit value VH, compared to a central range towards the center from the lower limit range A1 and the upper limit range A2. That is in the power conversion system mounted in a vehicle, the occasions in which the power supply voltage is in the lower limit range A1 or the upper limit range A2 are more frequent than those of other ranges. Such distribution of the occurrence frequency is determined by, for example, goodness of fit.

Therefore, the number of allocated switching speeds in which the switching speeds is allocated is increased and the interval between two adjacent allocated switching speeds is narrowed in the lower limit range A1 and the upper limit range A2 of the power supply voltage, compared to the central range. That is, the switching speeds are more densely allocated in the lower limit range A1 and the upper limit range A2 of the power supply voltage, and more sparsely allocated in the central range.

In terms of the relationship between power supply voltage and switching speed, a relationship in which the switching speed is decreased as the power supply voltage increases is determined. In this case, because there is denseness and sparseness in the allocation, the switching speeds are set at smaller fractions in the lower limit range A1 and the upper limit range A2 of the power supply voltage, compared to the central range. Changing of the switching speed is actualized by a configuration in which the resistance value of a gate charging path is able to be switched among a plurality of stages, or a configuration in which the resistance value of a gate discharging path is able to be switched among a plurality of stages.

The interval between two adjacent allocated switching speeds and the number of allocated switching speeds shown in FIG. 3 are examples. The number of allocated switching speeds can be decreased or increased from that shown in FIG. 3. In addition, the denseness of allocated switching speeds (i.e., the interval between two adjacent allocated switching speeds and the number of allocated switching speeds) in the lower limit range A1 and the upper limit range A2 of the power supply voltage may be the same. Alternatively, the denseness of allocated switching speeds may be more dense in the lower limit range A1 or more dense in the upper limit range A2. A configuration is also possible in which the denseness of allocated switching speeds are dense in only either of the lower limit range A1 and the upper limit range A2 of the power supply voltage, and substantially uniformly sparse in other ranges.

In the inverters 30 and 40, a correlation is present between the power supply voltage (system voltage) and an emitter-collector voltage Vce when the switching elements Q11 to Q16 are in an off state. Therefore, the drive unit 60 detects the Vce instead of the power supply voltage (system voltage) of the inverters 30 and 40. In this case, the parameter acquiring unit 63 acquires the Vce when the switching elements Q11 to Q16 are in an off state as the parameter. The switching speed setting unit 62 variably sets the switching speed based on the Vce.

In addition, as the parameter correlated with the output torque of the motors 11 and 12, the current flowing to the coils of the motor 11 and 12, that is the output current of the inverters 30 and 40 may be used. In this case, the switching speed setting unit 62 variably sets the switching speed based on the output current or a correlated value thereof.

Regarding the output current of the inverters 30 and 40 as well, in a manner similar to the power supply voltage, it is thought that bias occurs in the occurrence frequency of the magnitudes of the output current. Therefore, a plurality of switching speeds are allocated at uneven intervals within a range from a lower limit value to an upper limit value of the output current, taking into consideration the occurrence frequency of the magnitudes of the output current.

Figure 4:
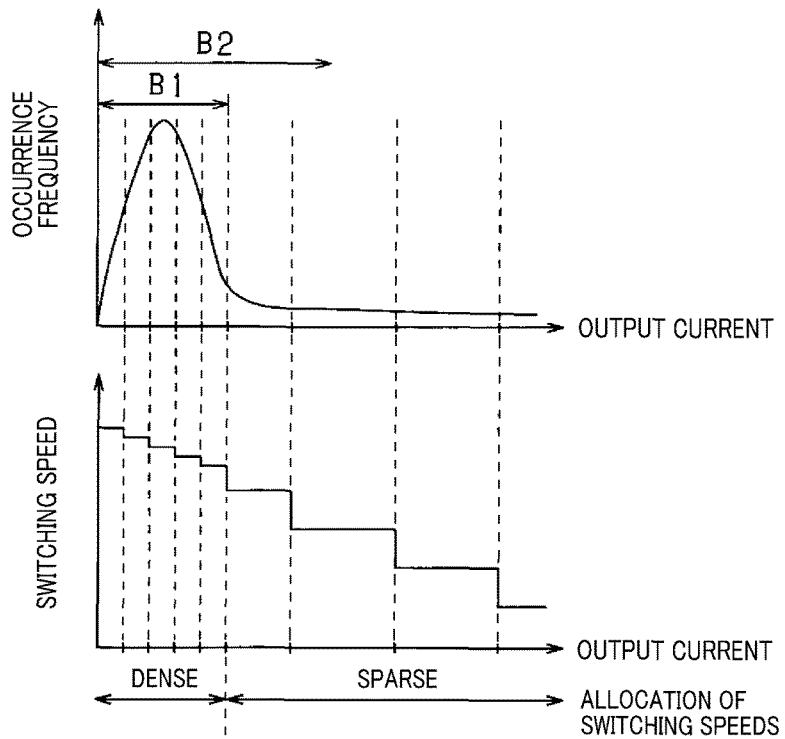
FIG. 4 is a diagram showing a relationship between an occurrence frequency of an output current and a switching speed.

Specifically, a case in which the motors 11 and 12 are driven during actual use of the vehicle will be supposed. As shown in FIG. 4, the occurrence frequency regarding the magnitude of the output current is not uniform. The occurrence frequency is higher in a low-current range B1 within the overall current range. That is in the motors 11 and 12 that are mounted in the vehicle, the occasions in which the motors 11 and the motors 12 are driven by a relatively low conduction current are more frequent than those in which the motors 11 and the motors 12 are driven by a relatively high conduction current. Such distribution of the occurrence frequency is determined by, for example, goodness of fit.

Therefore, the number of allocated switching speeds in which the switching speeds is allocated is increased and the interval between two adjacent allocated switching speeds is narrowed in the low-current range B1, compared to other ranges. That is, the switching speeds are more densely allocated in the low-current range B1, and more sparsely allocated in other ranges. In addition, the plurality of switching speeds are allocated such that the number of switching speeds greater than half of the total number of switching speeds is allocated within a range (range of B2 in FIG. 4) that is half of the overall range towards the low-current side from a center value.

In terms of the relationship between output current and switching speed, a relationship in which the switching speed is decreased as the output current increases is determined. In this case, because there is denseness and sparseness in the allocation, as described above, the switching speeds are set at smaller intervals in the low-current range B1, compared to other ranges.

The interval between two adjacent allocated switching speeds and the number of allocated switching speeds shown in FIG. 4 are examples. The number of allocated switching speeds can be decreased or increased from that shown in FIG. 4.

The drive unit 60 may detect a current Ice as the output current. The current Ice is the current flowing between the emitter and the collector of the switching elements Q11 to Q16. In this case, the parameter acquiring unit 63 acquires, as the parameter, the Ice when the switching elements Q11 to Q16 are in an on state. The switching speed setting unit 62 variably sets the switching speed based on the Ice.

According to the present embodiment described in detail above, the following excellent effects are achieved.

Regarding the switching elements Q11 to Q16, a plurality of switching speeds are discretely allocated to the respective magnitudes of the parameter at uneven intervals, where the parameter is correlated with the output torque of the motors 11 and 12 that are mounted in the vehicle. In addition, the number of allocated switching speeds is determined to be greater in a range in which the occurrence frequency of the parameter is high, compared to ranges in which the occurrence frequency is low. Based on the value of the parameter in each instance, at least one of the turn-on speed and the turn-off speed of the switching elements Q11 to Q16 is set to any of the plurality of switching speeds.

In this case, the plurality of switching speeds are allocated to the respective magnitudes of the parameter at uneven intervals. Therefore, loss reduction effect can be improved in a localized range within the overall possible range of the parameter. In this case, the total number of allocated switching speeds (the total number of allocated switching speeds that are set) can be limited, and complexity of the configuration can be minimized. In addition, the plurality of switching speeds are determined such that the number of allocated switching speeds is greater in a range in which the occurrence frequency is high, compared to a range in which the occurrence frequency is low. Therefore, the switching speed can be appropriately changed while taking into consideration the bias in the occurrence frequency. Thus, upon limiting the total number of allocated switching speeds (the total number of allocated switching speeds that are set), a desired loss reduction effect is achieved. As a result, the loss reduction effect can be improved while suppressing the complexity of the configuration.

The plurality of switching speeds are allocated at uneven intervals within a range from the lower limit value VL to the upper limit value VH of the power supply voltage. As a result, when bias occurs in the occurrence frequency of the power supply voltage (system voltage), the switching speed can be appropriately set.

The number of allocated switching speeds is increased in the lower limit range A1 and the upper limit range A2 of the power supply voltage, compared to the remaining central range. As a result, during actual use of the vehicle, the switching speed can be appropriately set while taking into consideration the voltage setting being more frequent near the lower limit value and near the upper limit value of the power supply voltage.

The number of switching speeds greater than half of the total number of switching speeds is allocated within half of the overall current range of the output current towards the low-current side from a center value. As a result, when bias occurs in the occurrence frequency of the output current in the overall current range of the output current and the peaks in the occurrence frequency are biased towards the low-current side, the switching speed can be accurately set.

Other Embodiments

For example, the above-described embodiment may be modified as follows.

In a system having the motor 11 (first rotating machine) that is more frequently operated to provide a power generating function and the motor 12 (second rotating machine) that is more frequently operated to provide a running function, even when the same parameter is used, a difference in the occurrence frequency regarding the magnitude of the parameter occurs. Therefore, a configuration is used in which the allocation of a plurality of first switching speeds to the respective magnitudes of the parameter in the inverter 30 on the motor 11 side is made to differ from the allocation of a plurality of second switching speeds to the respective magnitudes of the parameter in the inverter 40 on the motor 12 side.

Specifically, in the drive unit 60 on the inverter 30 side, the parameter acquiring unit 63 acquires the current flowing to the motor 11, that is, the output current to the motor 11 as the parameter. The switching speed setting unit 62 sets any of the plurality of first switching speeds based on the output current to the motor 11. In addition, in the drive unit 60 on the inverter 40 side, the parameter acquiring unit 63 acquires the current flowing to the motor 12, that is, the output current to the motor 12 as the parameter. The switching speed setting unit 62 sets any of the plurality of second switching speeds based on the output current to the motor 12. In this case, the allocation of the plurality of first switching speeds to the respective magnitudes of the output current to the motor 11 is made to differ from the allocation of the plurality of second switching speeds to the respective magnitudes of the output current to the motor 12.

Figure 5:
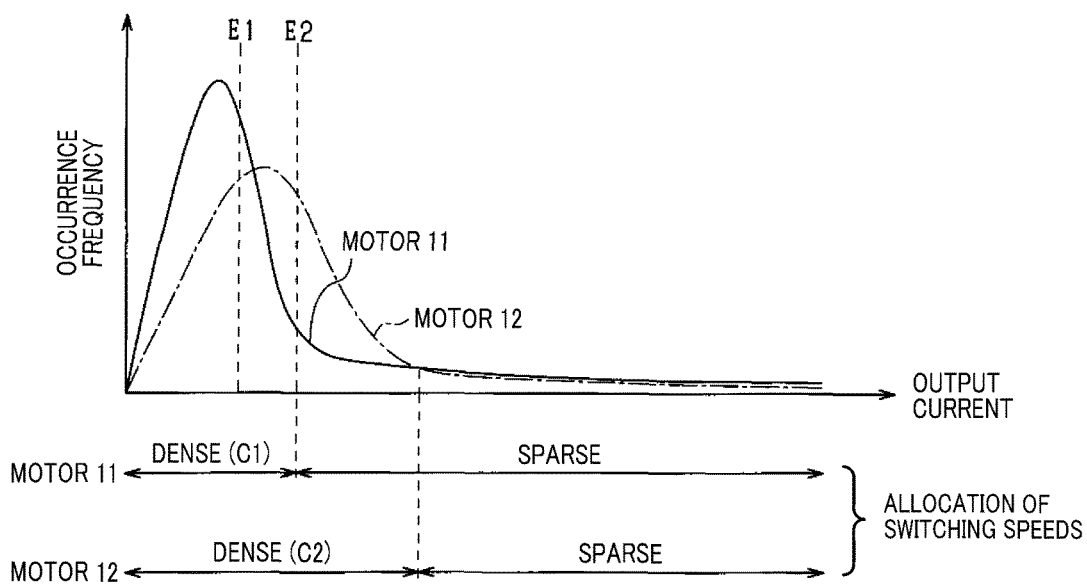
FIG. 5 is a diagram explaining the settings of the switching speed for each motor mounted to the vehicle.

The foregoing will be described with reference to FIG. 5. In FIG. 5, the peaks in the occurrence frequency of the output current to the motor 11 is more biased towards the low-current side than the peaks in the occurrence frequency of the output current to the motor 12. A reason for this is thought to be that, whereas the motor 11 is more frequently operated to provide the power generating function, the motor 12 is more frequently operated to provide the running function. Taking this into consideration, the ranges in which the allocation of the plurality of first switching speeds for the inverter 30 on the motor 11 side is made dense or sparse, and the ranges in which the allocation of the plurality of second switching speeds for the inverter 40 on the motor 12 side is made dense or sparse are individually determined. A dense range C1 on the motor 11 side is set to be smaller than a dense range C2 on the motor 12 side. The total number of allocation of first switching speeds and the total number of allocation of second switching speeds may be the same or different.

In this case, the output current value (E1 in FIG. 5; corresponding to a first value) is lower than the output current value (E2 in FIG. 5; corresponding to a second value). Here, the output current value (E1) corresponds to the switching speed of which an allocation number given in the order from the current lower limit value to the current upper value is the center value of the total number of allocated switching speeds, among the plurality of first switching speeds. The output current value (E2) corresponds to the switching speed of which the allocation number given in the order from the current lower limit value to the current upper value is the center value of the total number of allocated of switching speeds, among the plurality of second switching speeds.

In other words, when the total number of allocated first switching speeds is m and the total number of allocated second switching speeds is n, the output current value (E1) corresponds to the m/2-th switching speed from the current lower limit value, among the first switching speeds. The output current value (E2) corresponds to the n/2-th switching speed from the current lower limit value, among the second switching speeds. Thus, the output current value (E1) is lower than the output current value (E2).

In the above-described configuration, allocation of the switching speeds is individually performed for the motor 11 that is more frequently operated to provide the power generating function and for the motor 12 that is more frequently operated to provide the running function, taking into consideration the differences in the occurrence frequency regarding the magnitude of the output current. As a result, on/off switching can be appropriately performed in each of the motors 11 and 12.

According to the above-described embodiment, the drive units 60 are given the function for setting the switching speed of the switching elements Q11 to Q16. However, the configuration is not limited thereto. For example, the control unit 50 may be given the same function. In this case, a voltage sensor detects the power supply voltage applied from the converter 20 the inverters 30 and 40. A current sensor detects the respective phase currents of the motors 11 and 12 as the output current. The control unit 50 receives input of the detection values from the sensors. The control unit 50 may then appropriately set the switching speeds using switching-speed setting data based on the relationships in FIG. 3 and FIG. 4 that are stored in the control unit 50.

The drive units 60 then switches the on/off of the switching elements Q11 to Q16 based on switching speed information transmitted from the control unit 50.

The switching speeds may be unevenly allocated to the respective magnitudes of the parameter for the turn-on speed or the turn-off speed. The switching speeds may be evenly allocated to the respective magnitudes of the parameter for the other.

When the on/off of the switching elements Q11 to Q16 is switched, the switching speed may be variable for only one of on-switching and off-switching.

The power conversion system to which the present disclosure applies is not limited to that which supplies power to a plurality of motors. The power conversion system may be that which supplies power to a single motor. In addition, the power conversion circuit is not limited to a power conversion circuit that is mounted in a vehicle. The power conversion circuit may be that which is mounted in a moving body other than a vehicle, or a stationary apparatus.

What is claimed is:

1. A driving apparatus for a switching system that is applicable to a power conversion circuit which is electrically connected to a rotating machine mounted in a vehicle and controls an output torque of the rotating machine based on a requested command torque, the driving apparatus controlling a current flowing to the rotating machine by turning on/off the switching system, the driving apparatus comprising:
  a speed setting circuit that sets at least one of a turn-on speed and a turn-off speed for the switching system to a plurality of switching speeds that are discretely determined, based on a parameter that is correlated with the output torque and has a controllable value; and
  a driving circuit that turns on or off the switching system at the switching speeds set by the speed setting circuit, wherein
    the switching speeds are allocated to respective magnitudes of the parameter at uneven intervals, and determined such that a number of allocated switching speeds is greater in a range in which an occurrence frequency of the parameter is high, compared to a range in which the occurrence frequency of the parameter is low.

2. The driving apparatus according to claim 1, wherein:
  the power conversion circuit is connected to a power supply circuit of which a power supply voltage is variable;
  the speed setting circuit uses, as the parameter, the power supply voltage and sets the switching speeds based on the power supply voltage; and
  the switching speeds are allocated at uneven intervals within a range from a lower limit value to an upper limit value of the power supply voltage.

3. The driving apparatus according to claim 2, wherein:
  the switching speeds are determined such that the number of allocated switching speeds is greater in at least one of a lower limit range including the lower limit value of the power supply voltage and an upper limit range including the upper limit value of the power supply voltage, compared to a central range other than the lower limit range and the upper limit range.

4. The driving apparatus according to claim 3, wherein:
  the switching system includes a first switching element and a second switching element,
    the power conversion circuit is a power conversion system including
      a first power conversion circuit that is electrically connected to a first rotating machine that is more frequently operated to provide a power generating function, which includes the first switching element, and a second power conversion circuit that is electrically connected to a second rotating machine that is more frequently operated to provide a running function, which includes the second switching element, the driving apparatus turning on/off the first switching element in the first power conversion circuit and the second switching element in the second power conversion circuit;

the speed setting circuit is configured to:

set at least one of a turn-on speed and a turn-off speed for the first switching element in the first power conversion circuit to the switching speeds for the first switching element, based on a parameter that is correlated with the output torque of the first rotating machine and has a controllable value; and set at least one of a turn-on speed and a turn-off speed for the second switching element in the second power conversion circuit to the switching speeds for the second switching element, based on a parameter that is correlated with the output torque of the second rotating machine and has a controllable value, and allocation of the switching speeds for the first switching element to the respective magnitudes of the parameter differs from allocation of the switching speeds for the second switching element to the respective magnitudes of the parameter.

5. The driving apparatus according to claim 2, wherein:
the switching system includes a first switching element and a second switching element,
the power conversion circuit is a power conversion system including
a first power conversion circuit that is electrically connected to a first rotating machine that is more frequently operated to provide a power generating function, which includes the first switching element, and
a second power conversion circuit that is electrically connected to a second rotating machine that is more frequently operated to provide a running function, which includes the second switching element,
the driving apparatus turning on/off the first switching element in the first power conversion circuit and the second switching element in the second power conversion circuit;
the speed setting circuit is configured to:
set at least one of a turn-on speed and a turn-off speed for the first switching element in the first power conversion circuit to the switching speeds for the first switching element, based on a parameter that is correlated with the output torque of the first rotating machine and has a controllable value; and
set at least one of a turn-on speed and a turn-off speed for the second switching element in the second power conversion circuit to the switching speeds for the second switching element, based on a parameter that is correlated with the output torque of the second rotating machine and has a controllable value, and allocation of the switching speeds for the first switching element, to the respective magnitudes of the parameter differs from allocation of the switching speeds for the second switching element to the respective magnitudes of the parameter.

6. The driving apparatus according to claim 1, wherein:
the speed setting circuit uses, as the parameter, the current flowing to the rotating machine and sets the switching speeds based on the current; and
the switching speeds are allocated at uneven intervals within an overall current range from a lower limit value to an upper limit value of the current, and a number of switching speeds that is greater than half the total number of the switching speeds is allocated in half of the overall current range towards a lower-current side than a center value.

7. The driving apparatus according to claim 6, wherein:
the switching system includes a first switching element and a second switching element,
the power conversion circuit is a power conversion system including
a first power conversion circuit that is electrically connected to a first rotating machine that is more frequently operated to provide a power generating function, which includes the first switching element, and
a second power conversion circuit that is electrically connected to a second rotating machine that is more frequently operated to provide a running function, which includes the second switching element,
the driving apparatus turning on/off the first switching element in the first power conversion circuit and the second switching element in the second power conversion circuit;
the speed setting circuit is configured to:
set at least one of a turn-on speed and a turn-off speed for the first switching element in the first power conversion circuit to the switching speeds for the first switching element, based on a parameter that is correlated with the output torque of the first rotating machine and has a controllable value; and
set at least one of a turn-on speed and a turn-off speed for the second switching element in the second power conversion circuit to a the switching speeds for the second switching element based on a parameter that is correlated with the output torque of the second rotating machine and has a controllable value, and
allocation of the switching speeds for the first switching element to the respective magnitudes of the parameter differs from allocation of the switching speeds for the second switching element to the respective magnitudes of the parameter.

8. The driving apparatus according to claim 7, wherein:
the speed setting circuit uses, as the parameter, a current flowing to the first rotating machine and sets the switching speeds for the first switching element based on the current;
the speed setting circuit uses, as the parameter, a current flowing to the second rotating machine and sets the switching speeds for the second switching element based on the current; and
a first value of the current is lower than a second value of the current, the first value of the current being allocated to a switching speed of which an allocation number given in an order from a lower limit value to an upper limit value of the current is a center value of the total number of allocated switching speeds, among the first switching speeds, and the second value of the current being allocated to a switching speed of which an allocation number given in an order from a lower limit value to an upper limit value of the current is a center value of the total number of allocated switching speeds, among the second switching speeds.

9. The driving apparatus according to claim 1, wherein:
the switching system includes a first switching element and a second switching element,
the power conversion circuit is a power conversion system including
a first power conversion circuit that is electrically connected to a first rotating machine that is more frequently operated to provide a power generating function, which includes the first switching element, and
a second power conversion circuit that is electrically connected to a second rotating machine that is more frequently operated to provide a running function, which includes the second switching element,
the driving apparatus turning on/off the first switching element in the first power conversion circuit and the second switching element in the second power conversion circuit;
the speed setting circuit is configured to:
set at least one of a turn-on speed and a turn-off speed for the first switching element in the first power conversion circuit to the switching speeds for the first switching element, based on a parameter that is correlated with the output torque of the first rotating machine and has a controllable value; and set at least one of a turn-on speed and a turn-off speed for the second switching element in the second power conversion circuit to the switching speeds for the second switching element, based on a parameter that is correlated with the output torque of the second rotating machine and has a controllable value, and
allocation of the switching speeds for the first switching element to the respective magnitudes of the parameter differs from allocation of the switching speeds for the second switching element to the respective magnitudes of the parameter.

10. The driving apparatus according to claim 9, wherein:
the speed setting circuit uses, as the parameter, a current flowing to the first rotating machine and sets the switching speeds for the first switching element, based on the current;
the speed setting circuit uses, as the parameter, a current flowing to the second rotating machine and sets the switching speeds for the second switching element, based on the current; and
a first value of the current is lower than a second value of the current, the first value of the current being allocated to a switching speed of which an allocation number given in an order from a lower limit value to an upper limit value of the current is a center value of the total number of allocated switching speeds, among the first switching speeds, and the second value of the current being allocated to a switching speed of which an allocation number given in an order from a lower limit value to an upper limit value of the current is a center value of the total number of allocate switching speeds, among the second switching speeds.

11. A system comprising:
a power conversion circuit that is electrically connected to a rotating machine mounted in a vehicle, which controls an output torque of the rotating machine based on a requested command torque, the power conversion circuit including a switching element; and
a driving apparatus of the switching element, which controls a current flowing to the rotating machine by turning on/off the switching element,
the driving apparatus comprising:
a speed setting circuit that sets at least one of a turn-on speed and a turn-off speed for the switching element to a plurality of switching speeds that are discretely determined, based on a parameter that is correlated with the output torque and has a controllable value; and
a driving circuit that turns on or off the switching element at the switching speeds set by the speed setting circuit, wherein
the switching speeds are allocated to respective magnitudes of the parameter at uneven intervals, and determined such that a number of allocated switching speeds is greater in a range in which an occurrence frequency of the parameter is high, compared to a range in which the occurrence frequency of the parameter is low.

12. A driving method for a switching element that is applicable to a power conversion circuit which is electrically connected to a rotating machine mounted in a vehicle and controls an output torque of the rotating machine based on a requested command torque, the driving method controlling a current flowing to the rotating machine by a driving apparatus that turns on/off the switching element, the driving method comprising:
setting, by a speed setting circuit provided in the driving apparatus, at least one of a turn-on speed and a turn-off speed for the switching element to a plurality of switching speeds that are discretely determined, based on a parameter that is correlated with the output torque and has a controllable value; and
turning on or off, by a driving circuit provided in the driving apparatus, the switching element at the switching speeds set by the speed setting circuit, wherein
the switching speeds are allocated to respective magnitudes of the parameter at uneven intervals, and determined such that a number of allocated switching speeds is greater in a range in which an occurrence frequency of the parameter is high, compared to a range in which the occurrence frequency of the parameter is low.

* * * * *